Figure 1:
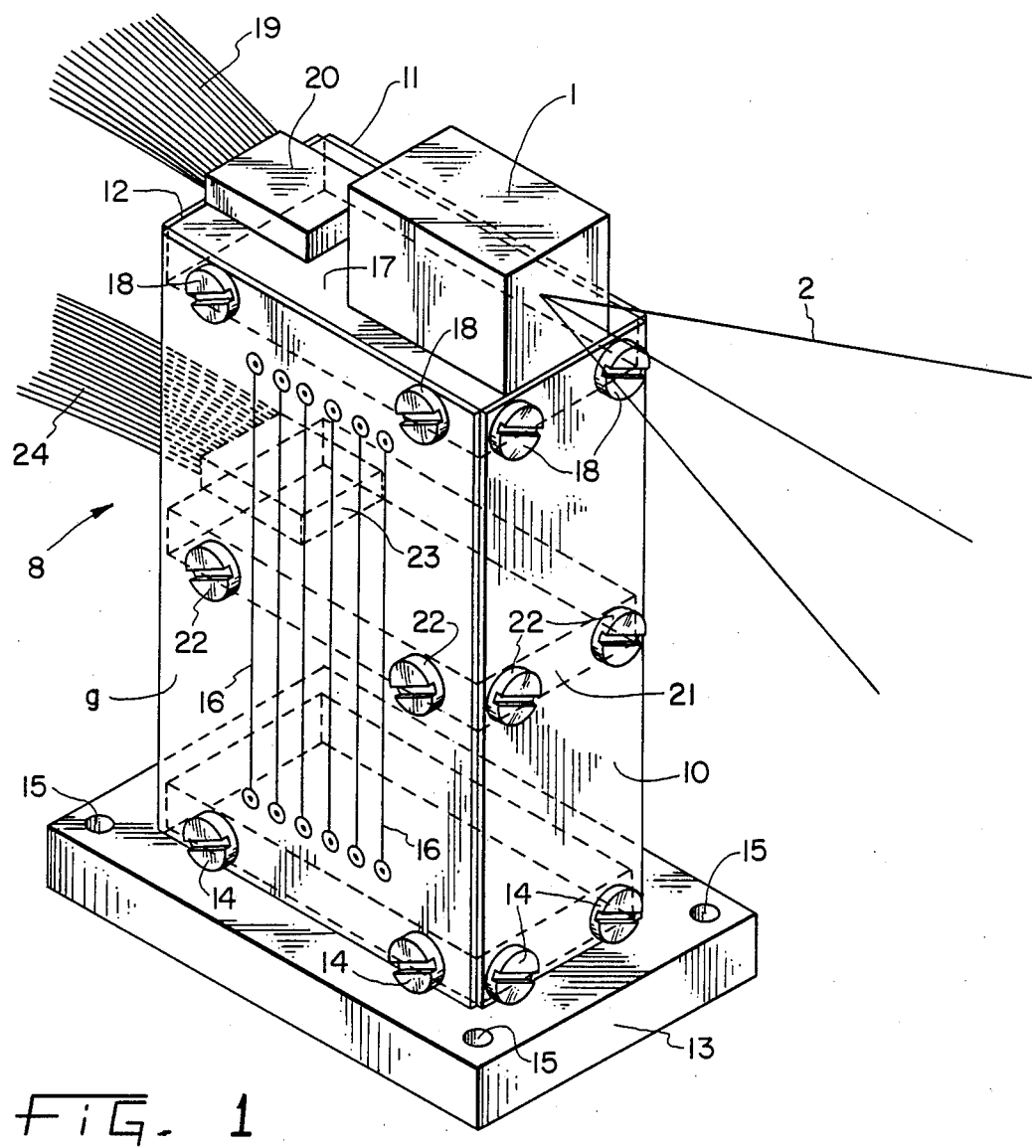

United States Patent [19]

Riedel et al.

[11] Patent Number: 4,985,805
[45] Date of Patent: Jan. 15, 1991

[54] DEVICE FOR THE COOLING OF OPTOELECTRONIC COMPONENTS AND USE OF A FLANGE JOINT USED THEREOF

[75] Inventors: Wolfgang Riedel, Neuenburg; Richard Wissler, Freiburg; Otmar Fichter, March; Klaus Gregorius, Neunkirchen; Gerhard Mattauch, Kleinsendelbach; Heinz Schorner, Röthenbach, all of Fed. Rep. of Germany

[73] Assignees: Fraunhofer-Gesellschaft zur Forderung der Angewandten Forschung E.V.; Siemens Aktiengesellschaft, both of Munich, Fed. Rep. of Germany

[21] Appl. No.: 237,736
[22] PCT Filed: Nov. 20, 1987
[86] PCT No.: PCT/DE87/00538
§ 371 Date: Jul. 21, 1988
§ 102(e) Date: Jul. 21, 1988
[87] PCT Pub. No.: WO88/04107
PCT Pub. Date: Jun. 2, 1988

[30] Foreign Application Priority Data

Nov. 21, 1986 [DE] Fed. Rep. of Germany ....... 3639881
Nov. 18, 1987 [DE] Fed. Rep. of Germany ....... 3739085

[51] Int. Cl.$^5$ ............................................. H01L 25/04
[52] U.S. Cl. ......................................... 361/386; 357/82
[58] Field of Search ...................... 357/82, 83, 81, 79; 361/385, 382, 381, 386, 388, 389; 165/69, 80.3

[56] References Cited

U.S. PATENT DOCUMENTS 3,274,030 9/1966 Salomon ................................ 136/89
3,889,119 6/1975 Whicker .............................. 250/352
4,106,076 8/1978 Miller .................................. 361/394
4,161,747 7/1979 Frosh .................................... 357/82

FOREIGN PATENT DOCUMENTS 6902491 11/1968 Fed. Rep. of Germany .
6945492 11/1969 Fed. Rep. of Germany .
1514551 3/1974 Fed. Rep. of Germany .
3330708 3/1985 Fed. Rep. of Germany .
3445674 6/1986 Fed. Rep. of Germany .

OTHER PUBLICATIONS

"Wave-Number Stability of a Laser Diode Mounted in a Closed Cycle Helium Refrigerator", The Review of Scientific Instruments, vol. 50, No. 12, 1979.

Primary Examiner—Roy N. Envall, Jr.
Attorney, Agent, or Firm—Jeffers, Hoffman & Niewyk

[57] ABSTRACT

In a device for the cooling of optoelectronic components (1) with an evacuated cooler housing mounted on a base, in which there are provided at least one holding device for components (1) which is thermally coupled with the cold station of a cooling unit through at least one flexible metal band (19), the housing of the cooling unit is for vibrational decoupling connected with the cooler housing and sealed against atmospheric pressure through ring-shaped rubber-elastic sealing means. The at least one holding device (8), through a flexible metal band (19) thermally coupled to a cold station, of a refrigeration unit, that protrudes into the cooler housing, comprises a retaining plate (17) which is arranged on one end of a thin-walled, essentially prismatic or cylindrical body from a thermally poorly conductive material, specifically epoxy resin panels (9, 10, 11, 12). The end of the epoxy resin panels (9, 10, 11, 12) opposite the retaining plate (17) is rigidly mounted on the base of a cooler housing through a metallic base (13).

17 Claims, 4 Drawing Sheets

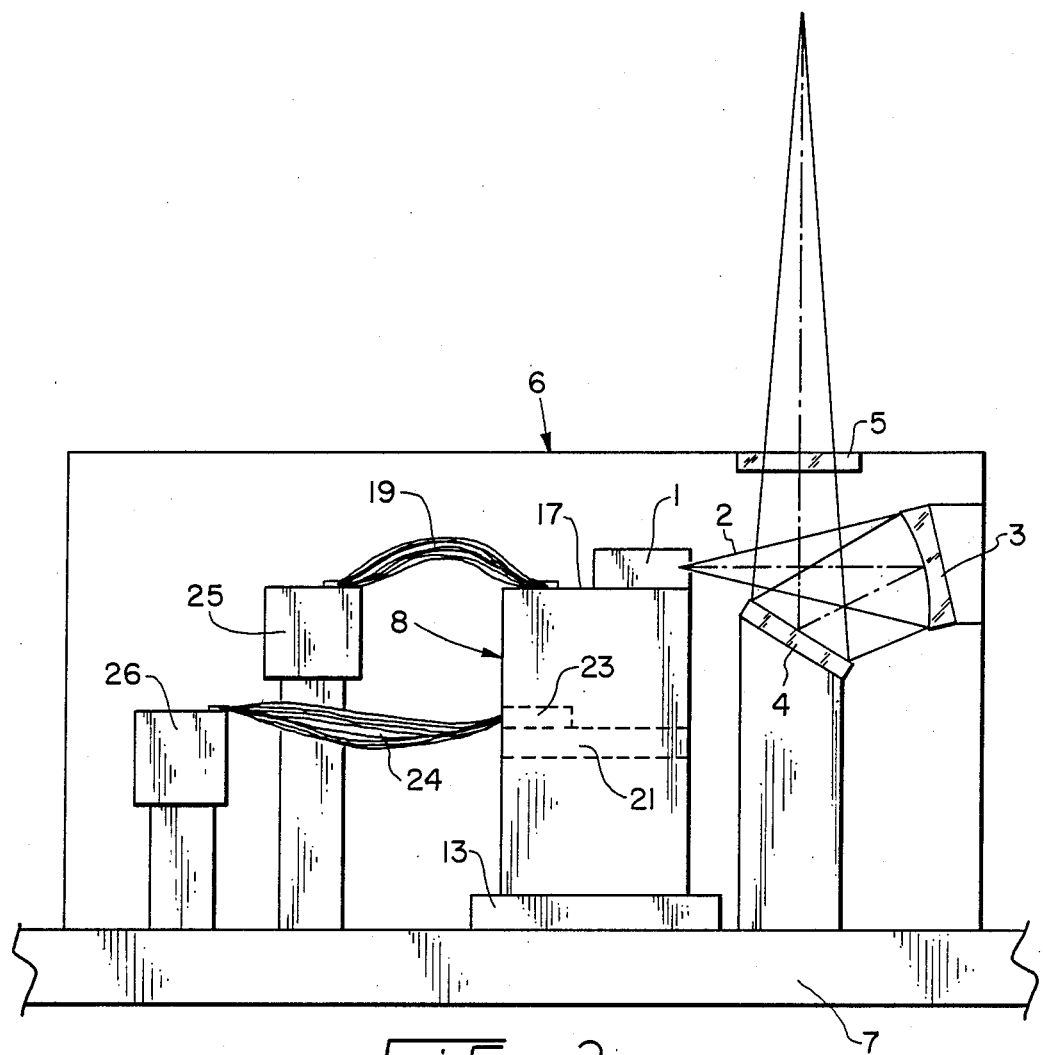
FIG. 2
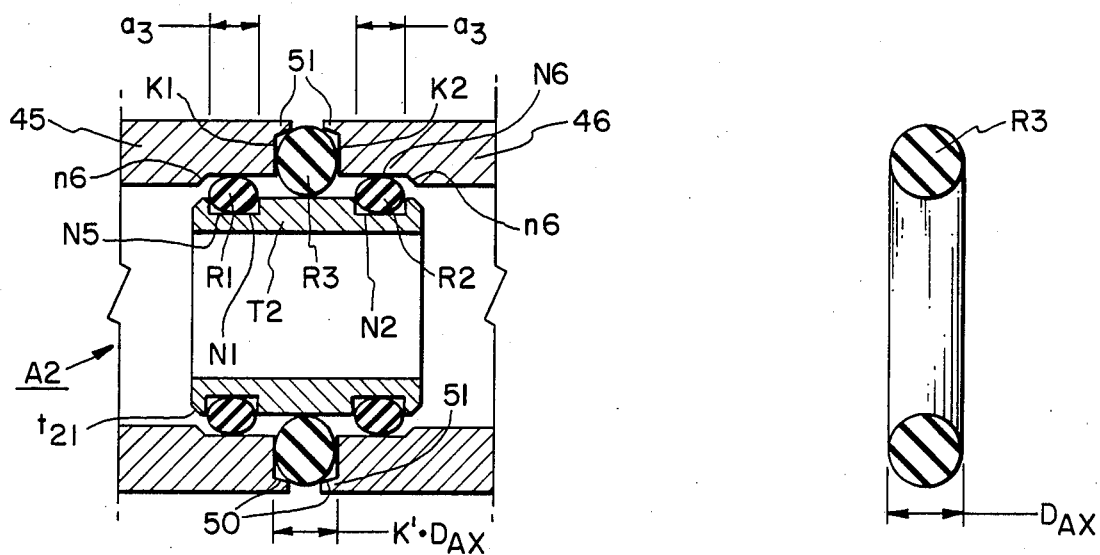
FIG. 7
FIG. 8

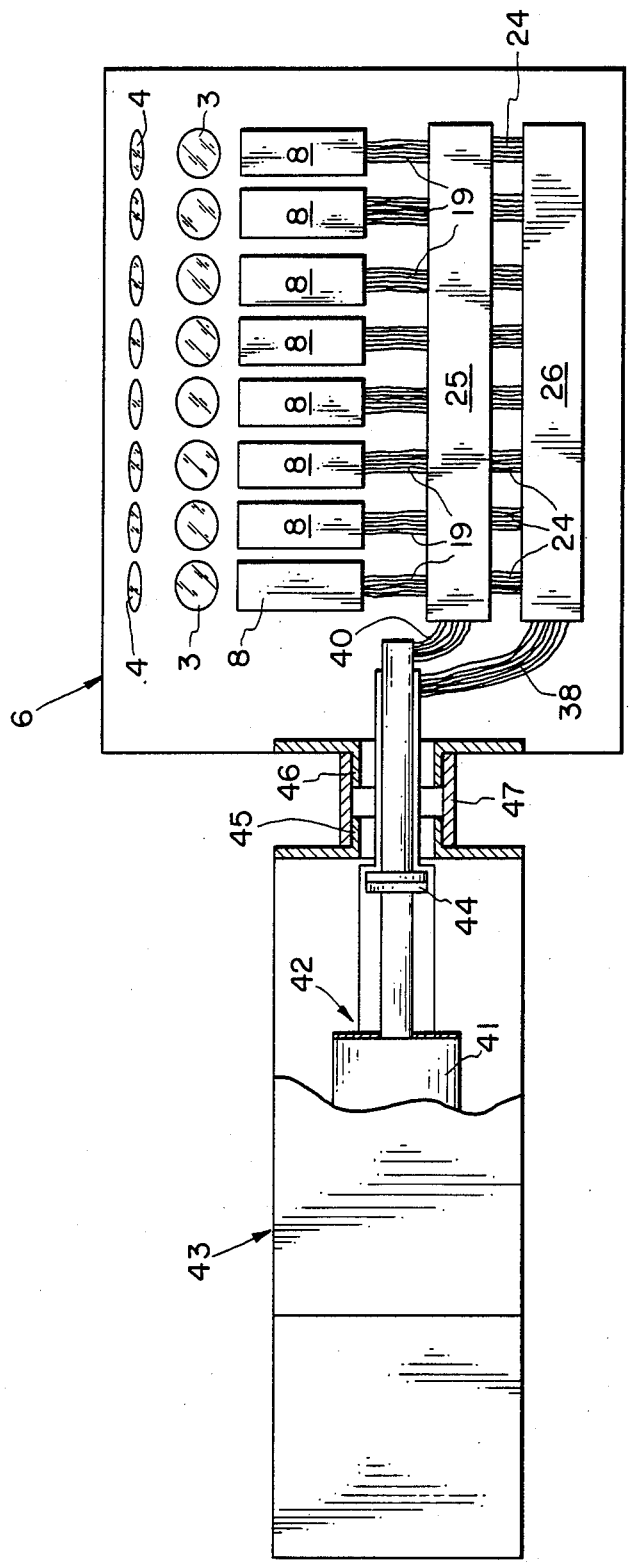

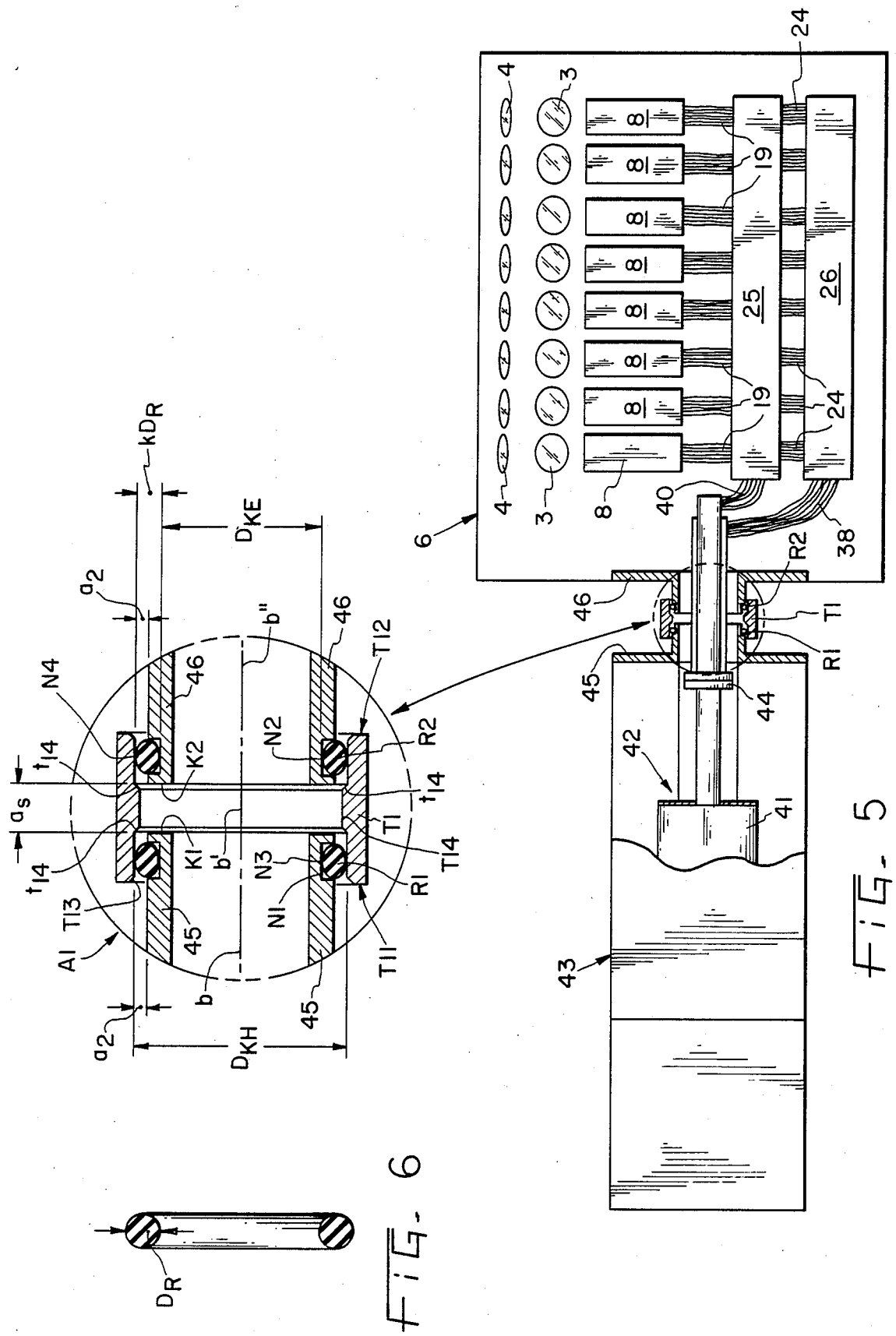

DEVICE FOR THE COOLING OF OPTOELECTRONIC COMPONENTS AND USE OF A FLANGE JOINT USED THEREOF

The invention concerns a device for the cooling of optoelectronic components, specifically infrared diode lasers and infrared detectors, with an evacuated cooler housing which is mounted on a base in which there are provided a holding device for the components which through at least one flexible metal band is thermally coupled with the cold station of a cooling unit, and at least one window.

Such a device is known from the German patent document No. 34 45 674 and serves the cooling of infrared diode lasers and infrared detectors at temperatures down to the range of 10 K.

Such low temperatures are usually generated using two-stage coolers according to the Sterling principle with a continuous helium circuit, where the areas with low temperature are insulated from a housing at room temperature by vacuum. The periodic helium expansion in the cooler causes mechanical vibrations which should only minimally transfer to thermally coupled diode lasers or detectors. The prior device provides for that purpose a bar arrangement that features a bar which extends transversely through the cooler housing and is mounted on both ends on rigid supports which are rigidly connected with a massive base on which the cooler housing is mounted with soft vibration dampers. While the known design achieves an effective vibration decoupling of the optoelectronic components, the cooler housing vibrates and thus also the window which is provided in the cooler housing for the emergent or incident radiation. Minute reflections on the window cause the back coupling of fractions of the radiation intensity back to the radiation supplies, which greatly influences especially diode lasers. With the window vibrating in the path of rays, the reflected radiation is irregularly modulated, causing severe disturbances in diode lasers.

Based on this prior art, the invention addresses the problem of providing a cooling device of the initially mentioned type where both interferences by vibration of the holding device and interferences by vibrations of the cooler housing are effectively suppressed.

This problem is inventionally solved in that the housing of the cooling unit is for vibrational decoupling connected with the cooler housing and sealed against atmospheric pressure through ring-shaped rubber-elastic sealing means and in that the singular holding device, thermally coupled through a flexible metal band with a cold station protruding into the cooler housing, features a holding plate which is arranged on one end of a thin-walled, essentially prismatic or cylindrical hollow body from thermally poorly conducting material, the other end of which body is rigidly connected with the base of the cooler housing.

An object of the invention is also the use of a flange joint featuring the ring-shaped rubber-elastic sealing means.

In a suitable embodiment of the invention, the prismatic or cylindrical hollow body consists of four epoxy resin panels of slight material thickness which rectangularly are connected rigidly with one another. Formed in this way is a rigid structure which in the panel direction nonetheless is a poor thermal conductor.

One arrangement offers the additional advantage that the temperature of the various optoelectronic components can be adjusted and controlled separately. The distributor rails to which the copper bands of the various holding devices are thermally coupled are preferably so mounted that they can thermally expand in longitudinal direction but, to avoid the transmission of vibrations, cannot move as a whole.

The invention will be more fully explained hereafter with the aid of an embodiment illustrated in the drawing.

Figure 3:
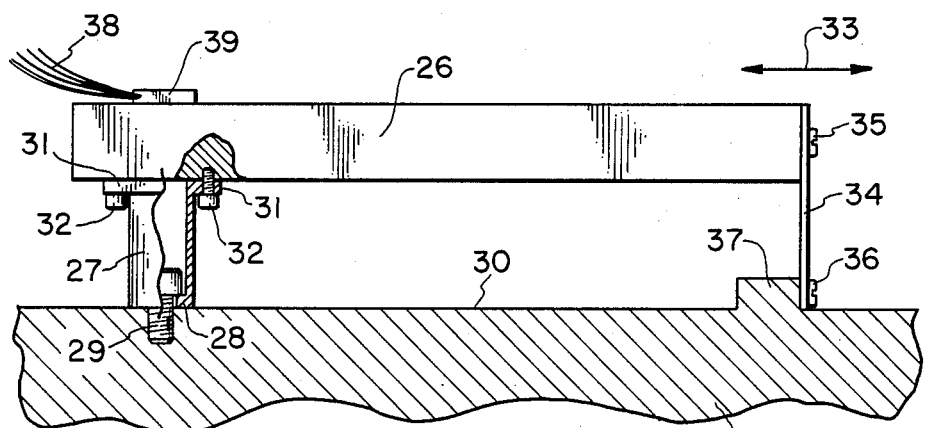

FIG. 1 shows a holding device of the device for the cooling of optoelectronic components in a perspective view;

FIG. 2, a sectional view of the cooler housing of the device;

FIG. 3, a lateral view of a distributor rail, partly in section, illustrating how the distributor rail is mounted on the base of the cooler housing;

FIG. 4, a plan view of the cooling device, partly in section;

FIG. 5, a modification of the embodiment according to FIG. 4 concerning the rubber-elastic sealing means, with the flange joint drawn at a larger scale;

FIG. 6, an as yet uninstalled and, therefore, uncompressed sealing ring;

FIG. 7, another embodiment of the flange joint illustrated in FIG. 5 at a larger scale; and FIG. 8, an as yet uninstalled axial ring seal for the flange joint according to FIG. 7.

FIG. 1 depicts in a perspective view an optoelectronic component 1 which, e.g., may be an infrared diode laser or an infrared detector for operation down into the 10-K range. Coordinated with the optoelectronic component 1 is a diverging path of rays 2, which in FIG. 2 can be seen as a lateral view and with which there are coordinated a first stationary mirror 3 and a second stationary mirror 4 as well as a window 5 in a cooler housing 6.

The cooler housing 6 is mounted on a base 7 illustrated in FIG. 2 and contains in the embodiment illustrated in the drawing several optoelectronic components 1 with coordinated holding devices 8, the design of which can be seen best in FIG. 1.

The holding device 8 illustrated in FIG. 1, for the optoelectronic component 1, is composed of four glass fiber-reinforced epoxy panels 9, 10, 11 and 12 which with the aid of screws 14 are rectangularly screwed to a metallic base. The metallic base 13, in turn, is mounted on the base 7, as can be seen from FIG. 2. Four bores 15 are provided in the metallic base for screw connection with the base 7.

The glass fiber-reinforced epoxy panels 9, 10, 11 and 12 have a low specific thermal conductance and a very small cross-sectional area. The epoxy panel 9 is provided with conductor tracks 16 which, as will follow from the subsequent description, are cooled the same as the optoelectronic component 1 and, as compared to connecting lines, are better protected from damage.

The four epoxy panels 9, 10, 11, 12 screwed to the base 13 are on their end opposite the base 13 screwed to a retaining plate 17, with the aid of screws 18. The retaining plate 17 consists of a thermally well conducting metal and is thermally and mechanically connected with the optoelectronic component 1. The heat generated by the optoelectronic component 1 is removed with the aid of a first flexible copper band 19, in the fashion described hereinafter. The flexible copper band 19 is thermally well connected with the retaining plate 17 through a joining piece 20.

As illustrated by broken line in FIG. 1, the holding device 8 comprises in its center area between the retaining plate 17 and the base 13 a precooled metallic intermediate plate 21 which with the aid of screws 22 is mounted on the four epoxy panels 9, 10, 11, 12 in order to increase in this way the rigidity of the cross sectionally rectangular prism or cylinder formed by the epoxy resin panels 9, 10, 11, 12. A precooling is accomplished with the aid of the intermediate plate 21, by cooling it through a joining piece 23 and a second flexible copper band 24, as well in the manner described farther down.

In FIG. 2 it can be seen how the first flexible copper band 19 is thermally coupled with a first distributor rail 25 and the second flexible copper band 24 with a second distributor rail 26 which, somewhat below the first distributor rail 26 and parallel with it, extends within the cooler housing 6, which is sealed from the outside atmosphere. The distributor rails 25, 26 consist both of a thermally well conducting material and have a massive, approximately quadratic cross section. The mounting of the distributor rails 25, 26 on the base 7 is identical.

FIG. 3 shows the mounting of the second distributor rail 26 on the base 7. Arranged on the left end of the distributor rail 26 is a small duct or tube 27 of epoxy resin which on its bottom end features an inward pointing flange 28 which, with the aid of the screw 29 which is threaded into a threading provided in the base 7, is firmly secured to the top side 30 of the base 7 so as to produce a maximally rigid connection. On the end facing away from the base 7, the epoxy resin tube 27 possesses an outward pointing flange 31 which by means of several screws 32 is screwed to the underside of the second distributor rail 26.

On the opposite end, the distributor rail 26 is mounted in a fashion permitting it to be moved in the direction of double arrow 33 so as to permit length changes in case of temperature variations, but without permitting other movement. On the end face which in FIG. 3 points to the right, the second distributor rail 26 is connected with a screw to a glass fiber epoxy resin platelet 34 which is bendable in the direction of double arrow 33 and extends in a plane which is perpendicular to the drawing plane. A screw 35 is provided for mounting on the end face of the second distributor rail 26. The bottom end of the glass fiber epoxy resin platelet 34 is screwed to a shoulder 37 provided on the base 7, with a screw 36.

For cooling or heat removal, the second distributor rail 26 is thermally coupled with a flexible metal band 38, for instance a copper band, through the use of a joining piece 39. The first distributor rail 25 is correspondingly connected with a flexible metal band 40.

As can be seen in FIG. 4 in plan view, the flexible metal band 38 is thermally coupled with the first stage 41 of the cold station 42 of a dual-stage cooling unit 43 which produces vibrations. The second stage 44 of the cold station 42 of the cooling unit 43 is connected with the flexible metal band 40, constituting a thermal coupling with the optoelectronic component 1 through the flexible metal band 40, the first distributor rail 25 and the retaining plate 17.

The vibrating cooling unit 43 is mounted with vibration-damping rubber pads (not illustrated), which hardly transmit any vibration to base 7. As can be seen from FIG. 4, the cold station 42 of the cooling unit 43 protrudes by way of a neck 45 provided on the cooling unit 43 and a neck 46 provided on the cooler housing 6 into the interior of the cooler housing 6. A connection and a seal between the cooling unit 43 and the cooler housing 6 is established with the aid of ring-shaped rubber-elastic sealing means in the form of a hose 47 which is slipped on the necks 45 and 46, is made from rubber, silicone rubber or flour caoutchouc and is just stiff enough to absorb the atmospheric pressure load while on the other hand being sufficiently flexible to prevent a transmission of vibrations to the cooler housing 6. The hose 47 is capable of performing both axial, angular and lateral as well as torsional movements.

As shown in FIG. 4, eight holding devices 8 as well as eight first stationary mirrors 3 and eight second stationary mirrors 4 are provided in the cooler housing 6. The device illustrated in FIG. 4 thus permits the operation and cooling of eight optoelectronic components 1, whereby the temperature for each electronic component 1 can be adjusted and controlled separately. The desired temperatures of the individual optoelectronic components 1 on the retaining plate 17 of the eight holding devices 8 are adjusted through electronically controlled heating of the retaining plate 17.

Marked A1 as a whole, the flange joint according to FIG. 5 serves also to establish a vacuum-tight connection between the necks 45 and 46 that is decoupled from vibration and movable toward all sides to a limited extent, but serves also in a general way the connection between hollow bodies, which are illustrated enlarged in the section and may generally consist of tubes, sockets or housings with molded coupling ends. In the present case, the two hollow bodies are the coupling ends or necks of the cooling unit 43 and the cooler housing 6, with the illustrated flange joint A1 serving as a conduit for parts serving the electrical, mechanical and/or thermal connection, (for simplicity omitted in the enlarged section of FIG. 5 and FIG. 7).

The necks 45 and 46 will hereafter be called coupling ends. These are tubular and oppose each other at a spacing $a_1$. Near their respective end faces K1 and K2, between which the axial spacing $a_1$ exists, both necks 45 and 46 feature a circular groove, respectively N1 and N2, of rectangular cross section, which is recessed in their peripheries. Inserted in the grooves N1 and N2 is a ring seal R1, R2 from elastically deformable sealing material, each having the form of a so-called O-ring or round-section ring. The ring seals R1, R2 sit in their grooves N1, R2, that is, on the cylindrical circular surface N3 of the groove bottom, with a slight prestress and have a ring thickness such that in the as yet uncompressed condition (illustrated in the inserted, compressed condition) they protrude with a respective considerable part of their cross-sectional diameter $D_R$ beyond the groove depth (compare FIG. 6). As the coupling sleeve T1 is now slipped over the two coupling ends 45, each provided with a ring seal R1 and R2, or as the coupling ends are slipped into the coupling sleeve T1, the two ring seals R1, R2—as illustrated—are flattened under elastic deformation, producing a sealing surface pressure on the ring seat surfaces N3 of the groove bottom and on the as well cylindrical opposite seats N4 along the inside circumference of the coupling sleeve T1.

When signifying the diameter respective surrounding circular seat surfaces N3 of the coupling ends 45 and 46 as $D_{KE}$ and the diameter of the surrounding opposite circular seat surfaces N4 of the circular sleeve T1 as $D_{KH}$ and additionally the diameter of the as yet uncompressed ring seal R as $D_R$, as separately drawn in FIG. 6 once more, the following relation is obtained: $|(D_{KE}-D_{KH})|=k.D_R<D_R$, where the flattening factor k naturally must be smaller than 1. Factor k amounts to about 0.7 in the illustrated embodiment according FIG. 5. The "softer" the material of the ring seals the smaller may be k. The "harder" the material the greater will be k, the dimensionless value of which may generally range between 0.5 and 0.9.

To achieve a limited mobility toward all sides, the flange joint A1 according to FIG. 5 features gaps, and at that, the previously mentioned axial gap $a_1$ between the end faces K1, K2 of the two coupling ends 45, 46, and additionally radial gaps $a_2$ between the inside circumference of the coupling sleeve T1 and the outside circumference respective coupling ends 45 and 46. To obtain an enlarged flexing gap, the coupling sleeve T1 is additionally beveled at T13 on those surrounding edges of its end faces T11, T12 which are facing toward the coupling ends 45 and 46. As can be seen, the two coupling ends 45, 46, due to the flexing gaps and the ring seals R1, R2 inserted between them and the coupling sleeve, can to a limited extent move relative to each other axially, radially and laterally as well as tangentially. In the latter relative motion, the common axis b-b'-b" of the two coupling parts 45, 46, which normally are arranged equiaxially with one another, would break slightly at the point b', i.e., the partial axis b-b' would be able to perform relative to the partial axis b'-b" a slight break motion in the range of a few angular degrees, without detriment to the vacuum tightness of the flange joint. This is true also for the other illustrated relative motions. The flange connection is characterized by a very good vacuum tightness because the gases which tend to penetrate from outside through the gap $a_2$ into the evacuated interior of the flange joint are confronted by a relatively small, rubber-elastic sealing cross section of the ring seals R1, R2, which additionally are compressed. The cross-sectionally rectangular circular grooves N1, N2 serve to axially secure the ring seals R1, R2 while enabling a relative motion for the coupling ends 45, 46 with their inserted ring seals R1, R2 and the slipped-on coupling sleeve T1 in axial radial, tangential, lateral and angular direction as already illustrated, under retention of vacuum tightness. The coupling sleeve T1 features on its inside circumference a collar T14 which trapezoidally tapers inwardly and whose two bevels t14 serve as an axial stop in both axial directions as regards the ring seals R1, R2.

In the third basic design of a flange joint A2 according to FIG. 7, an inner coupling sleeve T2 is in the fashion of a stopper or cork nested over on both its ends—under insertion of at least one ring seal R1, R2 each—by the two coupling ends 45, 46, in bottleneck fashion, which are larger in diameter. The circular grooves N1, N2 corresponding to the circular grooves N1, N2 of FIG. 5 are in the present example arranged on the outside circumference of the coupling sleeve T2; their cross section is again rectangular. The inner ring seat surfaces are marked N5, the outer ones N6. The latter are arranged on the inside circumference of the two coupling parts 45, 46 in the thus, as also in FIG. 5, axial overlapping area $a_3$ and are designed as stepped recesses, each with a slanted annular face n6 on its two ends facing away from each other, which serve as axial movement limitation for the coupling sleeve T2 including the ring seals R1, R2.

The style A2 according to FIG. 7 enables an additional, elastically deformable ring seal R3 to sit on the outside circumference of the—now inner—coupling sleeve T2 in the axial area between the two ring seals R1, R2 or the corresponding radial ring seals, this additional ring seal R3—as illustrated—being flattened under elastic deformation, in installed condition, by the two end faces K1, K2 of the two coupling ends 45, 46 facing each other to a value k'x$D_{ax}$ of its cross-sectional diameter that exists in the as yet uncompressed condition. Corresponding to FIG. 6, FIG. 8 depicts the cross section of the additional ring seal R3 in uncompressed condition, with a diameter $D_{ax}$, and beside it there is illustrated the thickness of the ring seal R3 in installed, flattened condition with dimension lines, and marked k'X$D_{ax}$. The flattening factor k' in the axial direction is approximately 0.75 in this example. Regarding its material-contingent size, the same applies that was stated with regard to the flattening factor k.

In addition to the two end faces K1, K2 of the two coupling ends 45, 46, the inner beveled annular faces 50 of the two opposed, cross-sectionally trapeziodal projections 51 serve as seating faces for the ring seal R3. The bevels in the end face area of the coupling sleeve T2 serving the enlargement of the flexing gap are marked t21. The advantage of this flange joint A2 is specifically that it contains a two-step seal, that is, the gases of the ambient space, for instance $H_2$ or He, must negotiate two seal barriers, namely the first one with the additional ring seal R3 and serially thereafter the second one with one of the two ring seals R1 or R2, so that this flange joint A2 is especially suited for the ultrahigh vacuum technology. The damped, vibrationally decoupled flange connection, which additionally permits a limited movement toward all sides, is retained with the flexural possibilities as illustrated already with the aid of FIG. 5. The ring seals R1, R2, R3 consist preferably of a material selected from the group suitable for ultrahigh vacuum or high vacuum technology, for instance of an FKM fluor-elastomer viton, compound number 19457 or 19357. Another suitable, elastically deformable sealing material is Perbunan or Kalrez. Irrespective of the desired degree of vacuum tightness, it may be suitable to glue the ring seals R1, R2, R3 on at least one of their annular seat surfaces N3, N4, K1, K2. Another suitable type of connection is vulcanizing, for which purpose the assembled flange joint is briefly heated, for instance inductively, so that the contact surfaces of the ring seals enter with their seat surfaces respectively opposite seat surfaces locally into an intimate adhesive connection. However, this connection must not be of a strength such that the limited mobility of the flange joint will be impeded.

Owing to their good properties regarding easy assembly and disassembly, vibrational decoupling, vacuum tightness and limited omnidirectional mobility, the flange joints according to FIG. 5 through FIG. 8 have favorable and versatile applications in the vacuum and high vacuum technology, as coupling element between pipes, sockets or housings.

We claim:

1. An apparatus for the cooling of optoelectronic components such as infrared diode lasers and infrared detectors said apparatus comprising:
   a base;
   an evacuated cooler housing mounted on said base;

a cooling unit having a cooling unit housing and a cold station, said cooling unit extending into said evacuated cooler housing;

an elastic sealing means for sealingly coupling said cooling unit housing to said evacuated cooler housing;

at least one window in said evacuated cooler housing; and a holding means within said evacuated cooler housing for mounting the optoelectronic components, said holding means including a flexible metal band thermally coupled with said cold station, a thin-walled hollow body composed of thermally poor conducting material, a retaining plate on one end of said hollow body, and a retaining base rigidly connected to said base.

2. Device according to claim 1, characterized in that the thin-walled hollow body has a rectangular cross section and four sidewalls composed of glass fiber-reinforced epoxy resin panels.

3. Device according to claim 2, characterized in that at least one of the epoxy resin panels includes electrical connector tracks for electrical connection with the optoelectronic components.

4. Device according to claim 1 characterized in that the retaining plate is coupled with a second stage of the cold station of the cooling unit through a first flexible metal band, and in that between the retaining plate and the base of the cooler housing there is arranged a metallic intermediate plate which is thermally coupled with a first stage of the cold station of the cooling unit through a second flexible metal band.

5. Device according to claim 1 characterized in that in the cooler housing there are provided a plurality of holding means for optoelectronic components with coordinated windows.

6. Device according to claim 5, characterized in that in the cooler housing there are provided a plurality of holding means for optoelectronic components with coordinated mirrors.

7. Device according to claim 5 characterized in that the retaining plates connect through first flexible copper bands with a common, thermally conducting first distributor rail which through a first flexible metal band is coupled with the second stage of the cold station of the refrigeration unit, and in that the intermediate plate connects through second flexible copper bands with a common, thermally conducting second distributor rail which through a second flexible metal band is coupled with the first stage of the cold station of the cooling unit.

8. Device according to claim 7, characterized in that the first and/or second distributor rail is mounted on the base with the aid of a rigid, thermally poorly conductive spacer and on its second end with the aid of a spacer which is deformable in the longitudinal direction of the distributor bar.

9. Device according to claim 8, characterized in that the rigid spacer is a glass fiber epoxy resin tube and the deformable spacer is a glass fiber epoxy resin plate which extends transverse to the longitudinal direction of the distributor rail.

10. Device according to claim 1 characterized in that the cooling unit housing is mounted with vibration-damping rubber pads on the base which base extends beyond the edge of the cooler housing.

11. Device according to claim 1, characterized in that the elastic sealing means is connected to rotationally symmetric, mutually spaced and opposed coupling ends of the cooling unit housing and the cooler housing, characterized in that the two coupling ends which are to be connected with each other and are mutually spaced and opposed and/or a coupling sleeve which overlaps with the coupling ends while leaving a radial space in between includes on their circumference within the two overlapping areas coupling end/coupling sleeve at least one surrounding groove, said coupling end surrounding grooves facing toward the coupling sleeve and said coupling sleeve surrounding grooves facing toward the coupling ends, said surrounding grooves forming annular seat faces at least one elastically deformable ring seal inserted in each said coupling end surrounding grooves, each said seal being in the form of a round-section respectively O-ring of a ring thickness such that the seal ring protrudes from a surrounding groove in as yet uncompressed condition with a considerable part of its cross sectional diameter ($D_R$) extending beyond the groove depth, and in that the nested arrangement of the coupling ends and coupling sleeve provided with the ring seals are described by the equation:

$$|(D_{KE}-D_{KH})| = k \times D_R < D_R,$$

where $D_{KE}$ is the diameter of the surrounding annular seat surfaces of the coupling ends, $D_{KH}$ is the diameter of the surrounding annular seat faces of the coupling sleeve and k is a dimensionless flattening factor, where $k<1$ and where the ring seals, is mounted condition, are flattened in the radial direction in their ring thickness to the value $k \times D_R$ under elastic deformation, between their pertaining two annular seat faces.

12. Device according to claim 11, characterized in that the coupling sleeve is beveled on those surrounding edges of its end faces that face toward the coupling ends, for creating an enlarged flexural gap.

13. Device according to claim 11 characterized in that an inner coupling sleeve is nexted in stopper fashion over on both its ends—under insertion of at least one ring seal each—in bottleneck fashion by the two coupling ends, which are larger in diameter than said coupling sleeve.

14. Device according to claim 13, characterized in that an additional, elastically deformable ring seal is disposed around the outside circumference of the inner coupling sleeve in the axial area between that at least two radial ring seals, and in that this additional ring seal is flattened in installed condition under elastic deformation by the two end faces of the two coupling ends that face each other, to a value $k' \times D_{AX}$ of its cross-sectional diameter ($D_{AX}$) that exists in as yet uncompressed condition, with the dimensionless flattening factor being $k'<1$.

15. Device according to claim 13 characterized in that the ring seals consist of a material selected from the group of elastomers suited for the ultrahigh vacuum or high vacuum technology, for instance from an FKM fluor-elastomer viton of compound number 19457 or 19357, from Perbunan or Kalrez.

16. Device according to claim 11 characterized in that the ring seals are connected by gluing with at least one of their corresponding annular seat surfaces.

17. Device according to claim 11 characterized in that the ring seals are connected with at least one of their corresponding annular seat surfaces by vulcanizing.

* * * * *